United States Patent [19]

Miya et al.

[11] Patent Number: 5,341,111
[45] Date of Patent: Aug. 23, 1994

[54] MICROWAVE OSCILLATOR CIRCUIT

[75] Inventors: Tatsuya Miya; Kazuyoshi Uemura; Sadayoshi Yoshida, all of Tokyo, Japan

[73] Assignee: NEC Corporation, Tokyo, Japan

[21] Appl. No.: 945,615

[22] Filed: Sep. 16, 1992

[30] Foreign Application Priority Data

Sep. 17, 1991 [JP] Japan .................. 3-235295
Jun. 30, 1992 [JP] Japan .................. 4-172221

[51] Int. Cl.[5] .................. H03B 5/12; H03B 5/18; H03B 21/01
[52] U.S. Cl. .................. 331/96; 331/99; 331/37; 331/117 FE; 331/117 D; 455/333
[58] Field of Search .................. 331/96, 99, 117 FE, 331/117 D, 37, 42, 116 FE, 108 C; 455/333

[56] References Cited

U.S. PATENT DOCUMENTS 3,534,294 10/1970 Auer .................. 331/117 FE
4,376,918 3/1983 Masuda et al. .................. 331/116 FE
4,485,355 11/1984 Scott .................. 331/117 FE
4,605,909 8/1986 Tsironis .................. 331/117 FE X

*Primary Examiner*—David Mis
*Attorney, Agent, or Firm*—Sughrue, Mion, Zinn, Macpeak & Seas

[57] ABSTRACT

A microwave oscillator circuit is provided for decreasing the number of passive elements such as inductance, etc. in microwave oscillators and frequency doublers. A microwave oscillator circuit is connected to a resonator circuit generating a signal at a frequency f, and produces at its output a signal of frequency nf, and comprises a first field effect transistor having a gate connected to the resonator circuit, a second field effect transistor whose source/drain path is connected in series with the source/drain path of the first field effect transistor and a connecting circuit for coupling either the gate or source of the first field effect transistor to the gate of the second field effect transistor. A signal of frequency nf is output at a node corresponding to a connection point between the source of the first field effect transistor and the drain of the second field effect transistor.

11 Claims, 8 Drawing Sheets

MICROWAVE OSCILLATOR CIRCUIT

BACKGROUND OF THE INVENTION

1. Field of the Invention

The present invention relates to a microwave oscillator circuit, and more specifically to a microwave oscillator circuit such as a local oscillator for use in a frequency converter in a radio communication device.

2. Description of the Prior Art

Use is made conventionally, as a first local oscillator for use in a microwave communication device, of an FET oscillator equipped with a resonator circuit, oscillation frequency of which FET oscillator is defined by a resonance frequency of the resonator. Such microwave communication devices require varieties of local oscillation frequencies. For obtaining a desired oscillation frequency signal there are known two techniques: (1) one in which the local oscillator is directly brought into oscillation at a required frequency, and (2) the other in which it is previously brought into oscillation at a frequency 1/n times the required frequency and an oscillated signal is multiplied by n through a multiplying unit.

In the case where a k band or higher frequency signal whose direct oscillation is difficult is required, use is generally made of the foregoing latter technique (2). The latter technique is sometime employed also for cases where frequency stabilization is achieved by the use of a PLL, although a care should be taken for the even balance of the costs of a frequency divider and a multiplier and characteristics thereof. The multiplier basically doubles associated frequency and generally multiplies the frequency by 2 m (m: number of stages) in a multi-stage construction thereof.

Referring to FIG. 1, a prior art circuit equipped with a local oscillator and a multiplier is exempiarily illustrated. A section A indicates the local oscillator and a section B indicates the multiplier. The local oscillator A includes an FETQ1 as an FET for oscillation whose oscillatable frequency range is determined by a reactance element L1 and a capacitance element C3 connected to the drain side of FETQ1 and by a capacitance element C6 connected to the source side of FETQ1. A resonator circuit 1 is connected to a gate of the FETQ1, whereby the FETQ1 is brought into oscillation at a resonance frequency of the resonator 1. Elements L2 and L5 serve respectively as a bias feed element and a DC return element of the FETQ1 and provide choke circuits each having sufficiently high impedances to the oscillation frequency. Further, elements R2 and R11 are set to determine proper operating points as a self-bias circuit of the FETQ1.

An oscillation signal from the FETQ1 is inputted to the multiplier B through a capacitor C7 which serves to determine the extent of cutting of a DC component and the degree of coupling. The multiplier B comprises a first filter 4, a second filter 5, and a diode D1. The diode 1 produces spurious components of the input signal owing to non-linearity thereof, and a second harmonic component of the input signal can effectively be derived from an output terminal 8 by the use of the first filter 4 as a filter through which an input signal frequency can pass and further by the use of the second filter 5 as a filter through which a frequency twice that of the input signal can pass.

A bias circuit for the diode D1 comprises a choke circuit L6 and a resistor R12, which may be employed for applying bias voltage to the diode D1 and for simply providing a DC return not for bias feeding. In both cases the bias circuit operates as choke circuits.

The prior art microwave oscillator circuit constructed as above, however, suffers from difficulties: It requires bias circuits for the local oscillator A and the multiplier B because they are independently provided. In particular, for the local oscillator it requires L5 and L11 for the DC return. It is thereupon needed to realize high impedance with L5 because R11 is a source resistance which can not be a high resistance. This causes the microwave oscillator circuit to be large-sized. Particularly, construction of the microwave oscillator circuit as an MMIC (monolithic microwave IC) causes, if desired, the area of a passive element to be increased, which is disadvantageous in cost in comparison with discrete constructions and makes it difficult to construct the circuit as the MMIC.

SUMMARY OF THE INVENTION

In view of the drawbacks with the prior art, it is an object of the present invention to provide a microwave oscillator circuit which can be miniaturized and constructed as an MMIC with ease.

In accordance with the present invention, there is provided a microwave oscillator circuit comprising first and second FETs; said first FET including a source thereof being series-connected with a drain of said second FET; a resonator circuit being connected with a gate of said first FET, said microwave oscillator circuit being brought into oscillation at a resonance frequency of said. resonator, said first FET providing an oscillation signal thereof to a gate of said second FET, whereby a signal of a frequency twice the oscillation frequency of said first FET is yielded from the drain of said second FET.

BRIEF DESCRIPTION OF THE DRAWING

The above and other objects, features and advantages of the present invention will be better understood from reading the following description of the preferred embodiments taken in connection with the accompanying drawings in which.

DETAILED DESCRIPTION OF THE PREFERRED EMBODIMENTS

Figure 1:
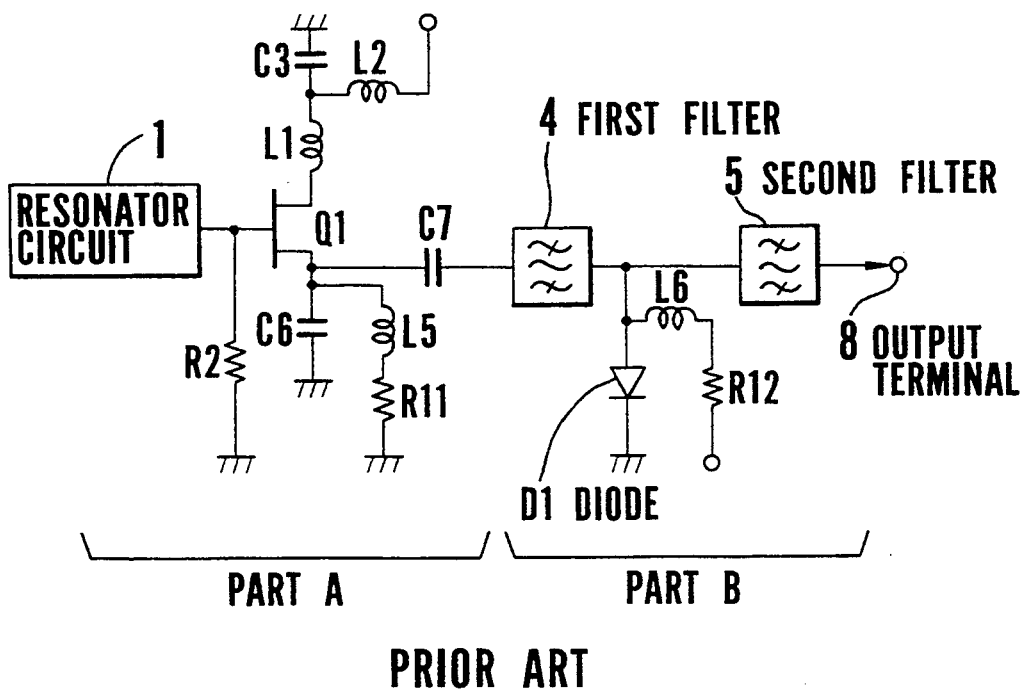
FIG. 1 is a circuit diagram exemplarily illustrating a prior art microwave oscillator.
Figure 2:
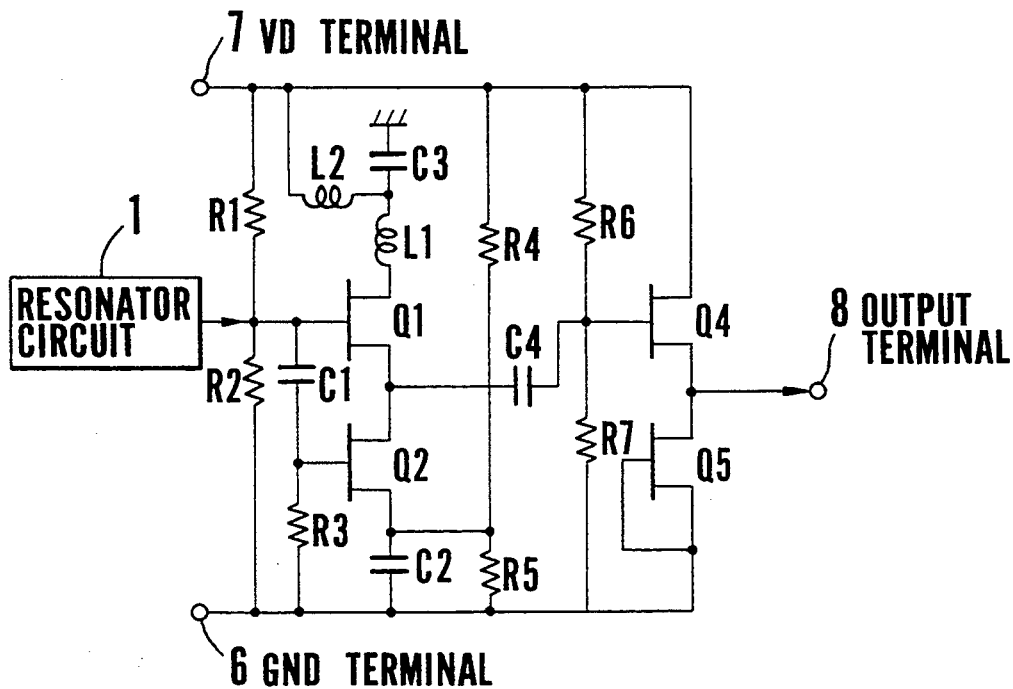
FIG. 2 is a circuit diagram illustrating a first embodiment of a microwave oscillator according to the present invention.

Referring to FIG. 2, a circuit diagram is exhibited which illustrates an embodiment of a microwave oscillator circuit according to the present invention. The illustrated circuit is constructed as a dual gate FET. In the circuit, FETQ1 serves as an FET for oscillation whose oscillation conditions are specified by L1, C3, and the equipment capacity of the FETQ2 connected with the source of FETQ1. For example, with L1 set to be 0.3~0.7 nH, C3 2 pF, and the FETQ2 a 200 μm gate width FET, FETQ1 oscillates substantially at 9~12 GHz.

By connecting in the aforementioned state the resonator circuit 1 to the gate of FETQ1, FETQ1 oscillates at the resonance frequency of the resonator circuit 1 located within an oscillatable frequency range of FETQ1. Although an oscillation output from FETQ1 is available from any portion of FETQ1, the output is likely to be generated at the gate and the source of FETQ1 both exhibiting relatively higher impedance. Contrarily, second FETQ2 operates as an FET mixer, i.e., a drain injection type FET mixer in which signals are inputted to the drain and gate of FETQ2 to permit a signal with sum and difference frequency components of the input signals to be derived from the drain of second FETQ2.

In the present embodiment, since the microwave oscillator circuit is constructed as a dual gate FET, high frequency coupling is provided across the gates of the dual gate FET excepting the DC return circuit thereof to generate a second harmonic on the basis of the mixing principle thereof.

Accordingly, as illustrated in FIG. 2, signals of the same frequency are inputted to the gate and drain of FETQ2 by rendering the gates of FETQ1 and FETQ2 to high frequency coupling through a coupling capacitor C1. There is therefore ensured a signal of a frequency twice the oscillation frequency of FETQ1 yielded from the drain of FETQ1 as the sum component. Conversion efficiency depends upon the operating point of FETQ2.

In the present embodiment, the gate width of FETQ2 is set to be larger than that of FETQ1. For example, with the assumption of the ratio of the gate widths of FETQ1 and FETQ2 set to be 5 : 1, when FETQ1 operates at $I_{DSS}$, FETQ2 operates at $1/10\ I_{DSS}$. Thereupon, for the conversion efficiency of FETQ2 operating at $1/10\ I_{DSS}$ for example, an about −4 dB conversion gain is ensured. This dominates the performance of the prior art multiplier composed of two filters and a diode.

FETQ4 is a source follower and constructs a buffer amplifier together with FETQ5. The second harmonic signal derived from the drain of FETQ2 is inputted to the gate of FETQ4 via a DC cut capacitor C4 and converted in its impedance by the buffer amplifier, and is thereafter outputted from the output terminal 8. Provision of the buffer amplifier enables FETQ1 to be operated without the oscillation conditions of FETQ1 being changed by load impedance connected to the output terminal 8.

Figure 3:
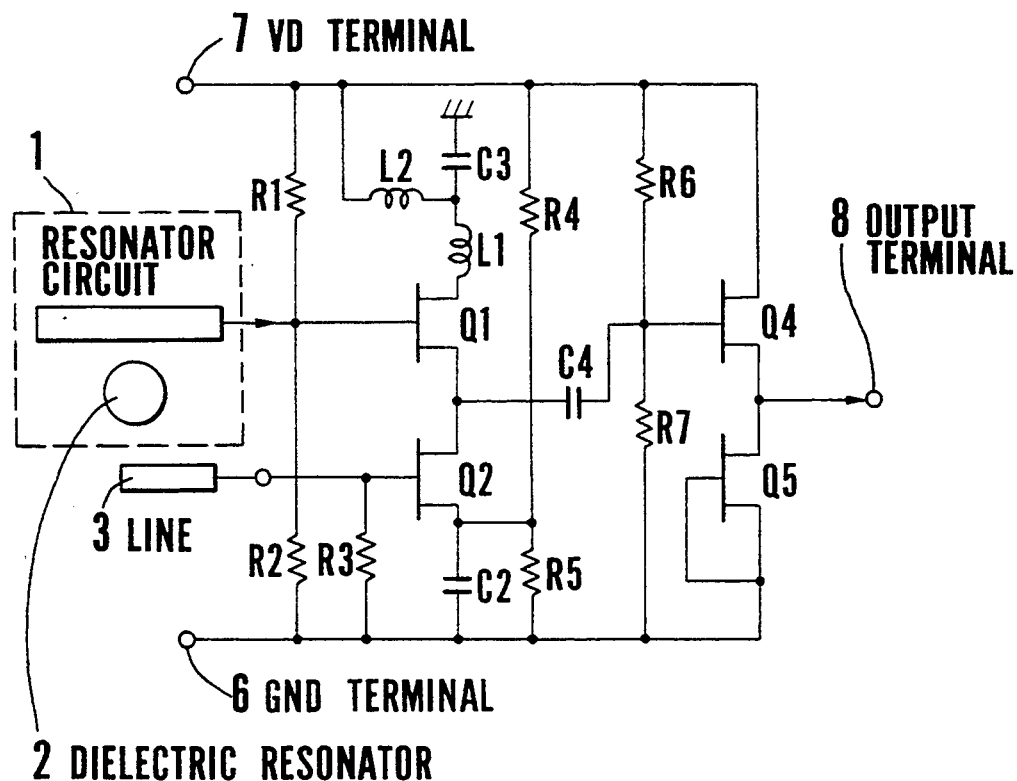
FIG. 3 is a like circuit diagram as that of FIG. 2 but illustrating a second embodiment of the present invention.

Referring to FIG. 3, there is illustrated a circuit diagram of a second embodiment of the present invention. The present embodiment is different from the first embodiment in that there is not provided the capacitance C1 serving to render the gates of the first and second FETQ1 and FETQ2 to the high frequency coupling in the present embodiment, and that the gate of the second FETQ2 is connectable as a terminal with an external line 3.

For example, provided a dielectric resonator 2 is employed as the resonator circuit 1, the gate of the first FETQ1 can be rendered to high frequency coupling with the line 3 of the gate of the second FETQ2 through the dielectric resonator. Particularly, provided the present embodiment is applied to the MMIC, provision of the foregoing terminal as in the present embodiment ensures effective transfer of oscillation power from the first FETQ1 to the gate of second FETQ2 without provision of internal high frequency coupling because the dielectric resonator 2 is connected with the external line 3 of the MMIC.

Figure 4:
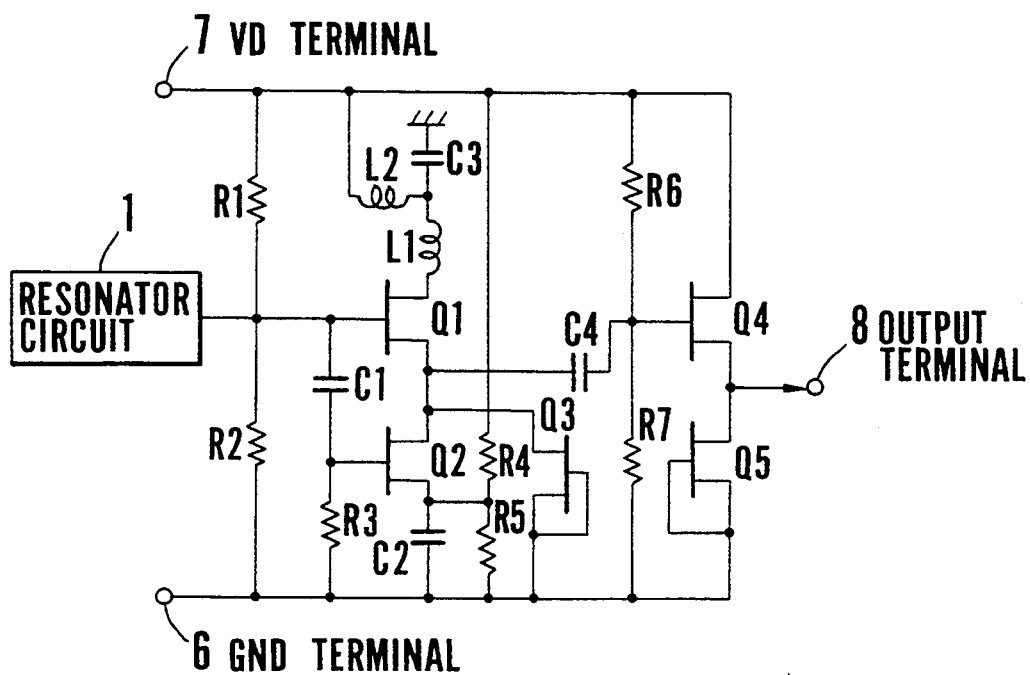
FIG. 4 is a like circuit diagram as that of FIG. 2 but illustrating a third embodiment of the present invention.

Referring to FIG. 4, there is illustrated a third embodiment of the present invention, in which a third FETQ3 is connected in parallel with second FETQ2 unlike the first embodiment.

Also in the present embodiment, signals of the same frequency are inputted to the gate and drain of the FETQ2 by rendering the gates of the FETQ1 and FETQ2 to high frequency coupling through the coupling capacitor C1. Hereby, the FETQ1 can provide from the drain thereof a signal of a frequency twice the oscillation frequency of the FETQ1 as a sum component. Conversion efficiency depends upon the operating point of the FETQ2.

In the present embodiment, third FETQ3 is connected in parallel with FETQ2 to permit a current flowing through the FETQ1 to flow toward FETQ3. For example, provided the gate width of FETQ3 is set to be ½ of the gate width of the FETQ1, and the gate and source of the FETQ3 are short-circuited, FETQ1 can be operated at ½ $I_{DSS}$ and FETQ3 can be pinched off by operating the FETQ3 as a current source and selecting the resistance of R5. Conversion efficiency of the FETQ2 in this case is of about −2 dB as the conversion gain. The result exceeds that of the prior art multiplier composed of two filters and a diode.

Figure 5:
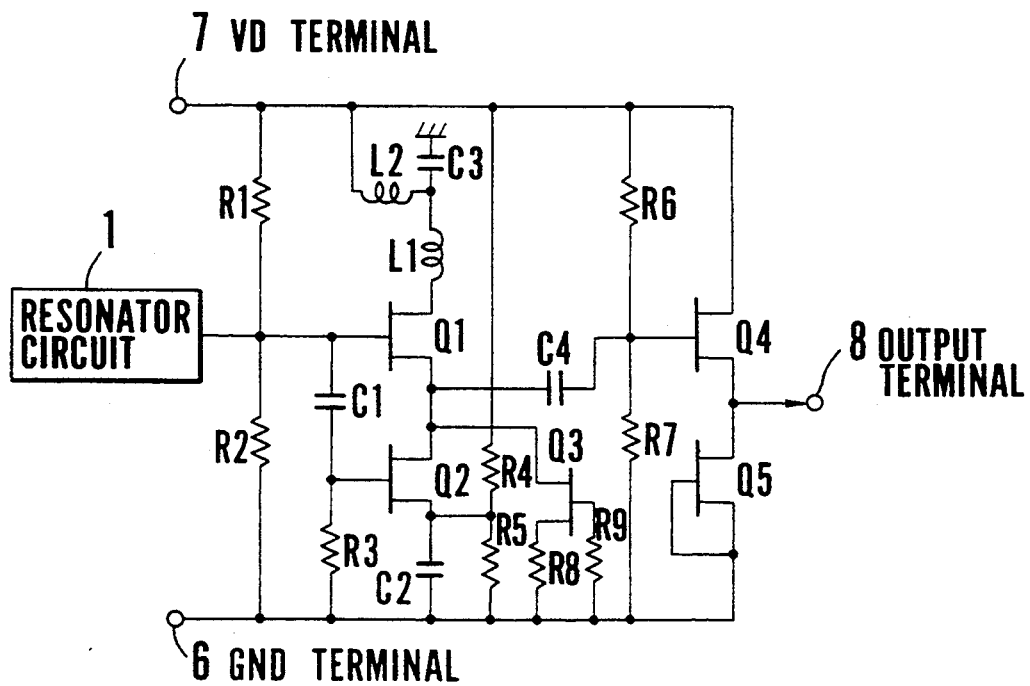
FIG. 5 is a like circuit diagram as that of FIG. 2 but illustrating a fourth embodiment of the present invention.

Referring to FIG. 5, there is illustrated a circuit diagram of a fourth embodiment of the present invention. The embodiment is different from the aforementioned third embodiment in that FETQ3 in the present embodiment is not operated at $I_{DSS}$ but can be set to a certain operating point with use of resistors R8 and R9 of a self-bias circuit. The operating point of FETQ1 can be changed with R8 and the gate width of FETQ3 can also be set arbitrarily.

Figure 6:
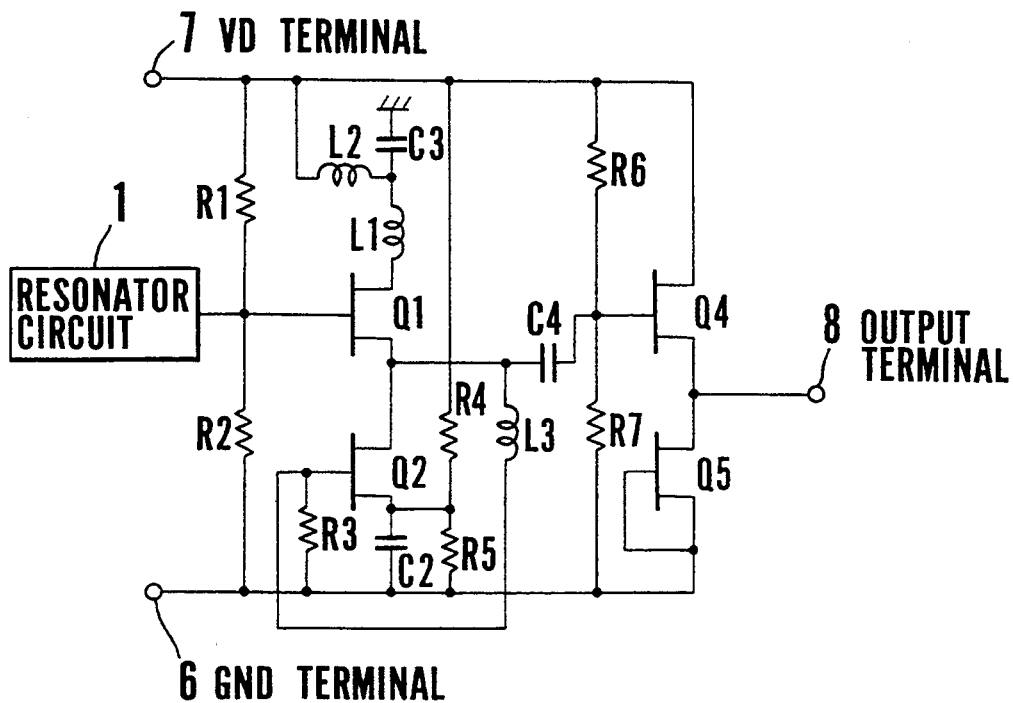
FIG. 6 is a like circuit diagram as that of FIG. 2 but illustrating a fifth embodiment of the present invention.

Referring to FIG. 6, there is illustrated a fifth embodiment of the present invention, in which part of the oscillation signal yielded from the source of FETQ1 is inputted to the gate of FETQ2 through inductance L3. Hereby, signals of the same frequency are inputted to the gate and drain of FETQ2, and hence there is ensured a sum signal of frequency twice the oscillation frequency of FETQ1 from the drain of FETQ1.

In the present embodiment, the second harmonic signal is inputted to FETQ4 through C4 and the signal at the oscillation frequency is inputted to the gate of FETQ2. The conversion efficiency of FETQ2 depends upon the operating point of FETQ2.

Further, in the present embodiment the gate width of FETQ2 is set to be larger than that of FETQ1. For example, assuming the ratio of the gate widths of FETQ2 and FETQ1 to be 5 : 1, FETQ2 can take its operating int at 1/10 $I_{Dss}$ when FETQ1 is operated at $\frac{1}{2}$ $I_{DSS}$. Conversion efficiency of FETQ2 operating at 1/10 $I_{Dss}$ is of about −4 dB as the conversion gain.

Figure 7:
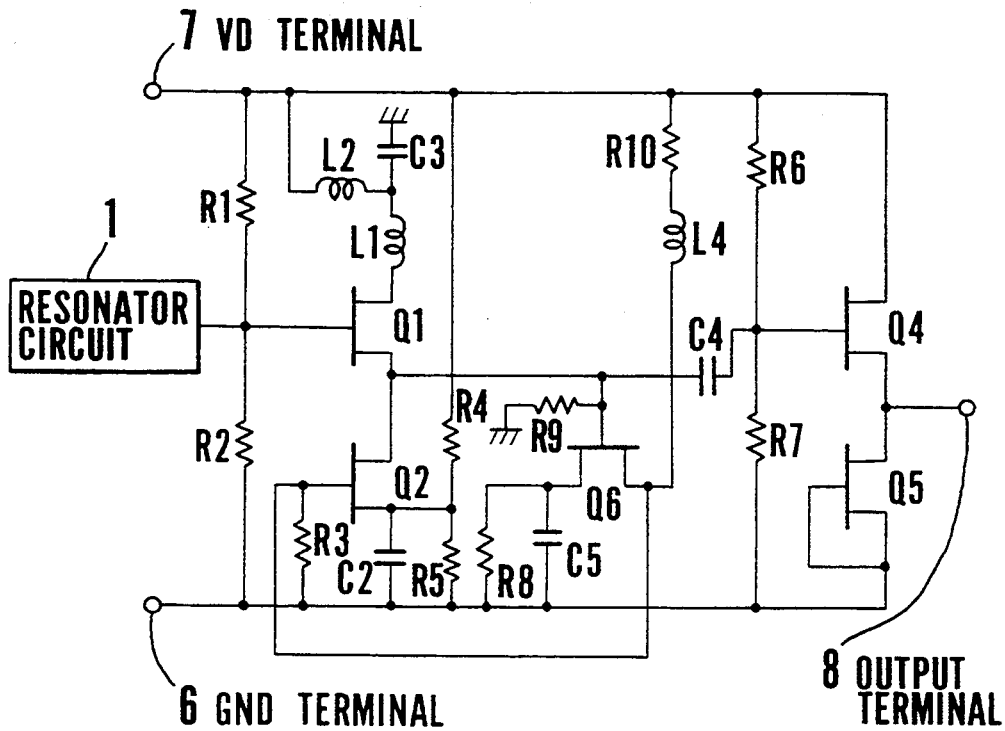
FIG. 7 is a like circuit diagram as that of FIG. 2 but illustrating a sixth embodiment of the present invention.

Referring to FIG. 7, there is illustrated a circuit diagram of a sixth embodiment of the present invention. The present embodiment is different from the aforementioned fifth embodiment in that instead of the oscillation output of FETQ1 being inputted to the gate of FETQ2 a signal amplified by FETQ6 is inputted to the gate of FETQ2. Hereby, an input level to FETQ2 is raised together with the rise of the conversion level of the second harmonic as well as the oscillation frequency signal can be amplified and the second harmonic signal can be reflected by selecting the matching conditions of the amplifier constructed with FETQ6. Thus, a more effective second harmonic signal is available from the output terminals 8. The present embodiment ensures a circuit which selectively amplifies only the oscillation frequency by realizing parallel resonance with use of L4, R10, and of equivalent input capacitance of FETQ2.

Figure 8:
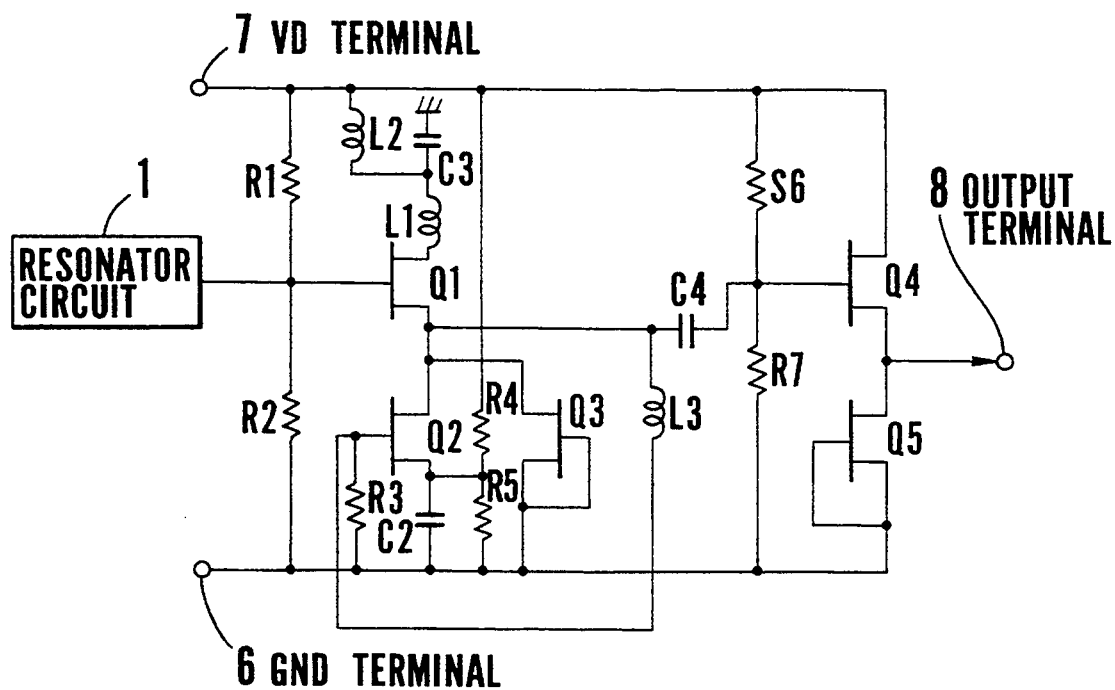
FIG. 8 is a circuit diagram illustrating a seventh embodiment of the present invention.

Referring to FIG. 8, there is illustrated a seventh embodiment of the present invention, in which instead of the use of the coupling capacitance C1 in the first embodiment part of the oscillation signal yielded from the source of FETQ1 is inputted to the gate of FETQ2 through the inductance L3. Hereby, signals of the same frequency are inputted to the gate and drain of FETQ3 and hence a sum signal of a frequency twice the oscillation frequency of FETQ1 is available from the drain of FETQ1.

In the present embodiment, the second harmonic is inputted to FETQ4 through C4 and L3 and the oscillation frequency signal is inputted to the gate of FETQ2. Conversion efficiency of FETQ2 depends upon the operating point of FETQ3.

Further, in the present embodiment, FETQ3 is connected in parallel with FETQ2, and a current flowing through FETQ1 flows through FETQ3. For example, FETQ3 is operable as a current source by setting the gate width of FETQ3 to be $\frac{1}{2}$ of the gate width of FETQ1 and short-circuiting the gate and the source to each other, and further FETQ1 can be operated at $\frac{1}{2}$ $I_{Dss}$ and FETQ2 operated at a point where it is pinched off. Conversion efficiency of FETQ3 is of about −2 dB as the conversion gain.

Figure 9:
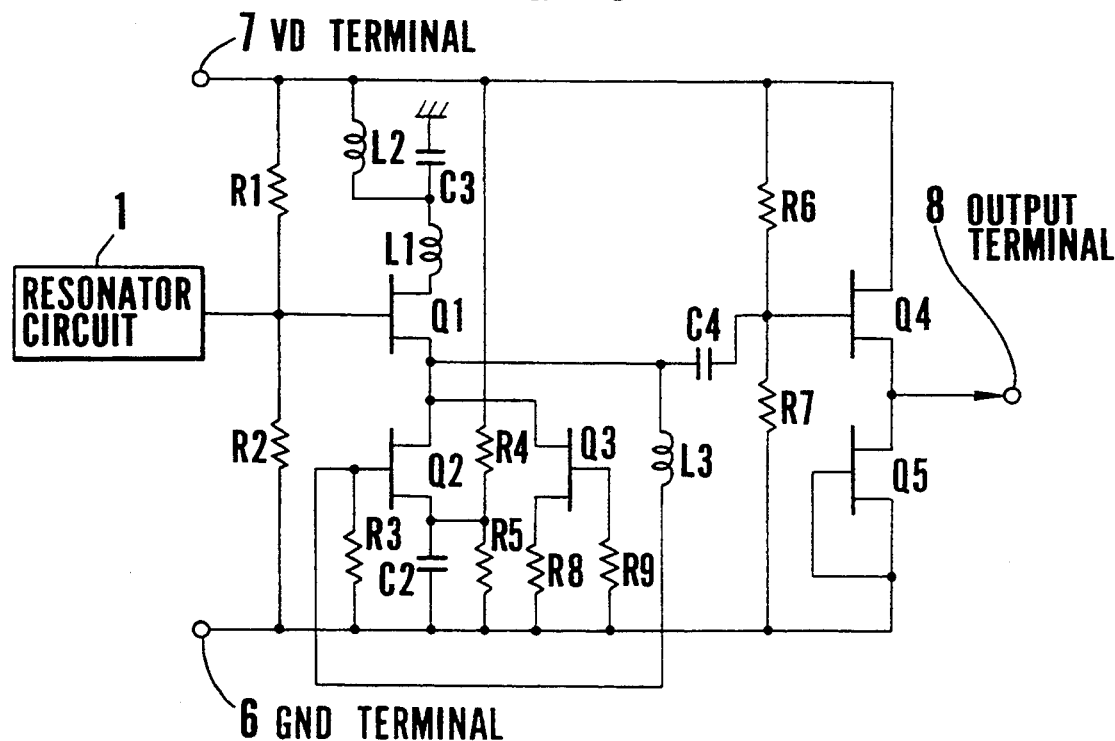
FIG. 9 is a like circuit diagram as in FIG. 2 but illustrating an eighth embodiment of the present invention.

Referring to FIG. 9, there is illustrated a circuit diagram of an eight embodiment of the present invention. The present embodiment is different from the case of FIG. 8 in that FETQ3 is not operated at $I_{DSS}$, but can be set to a certain operating point with use of a self-bias circuit composed of resistances R8 and R9. The operating point of FETQ1 can be changed by R8 and simultaneously the gate width of FETQ3 can also be set arbitrarily.

Figure 10:
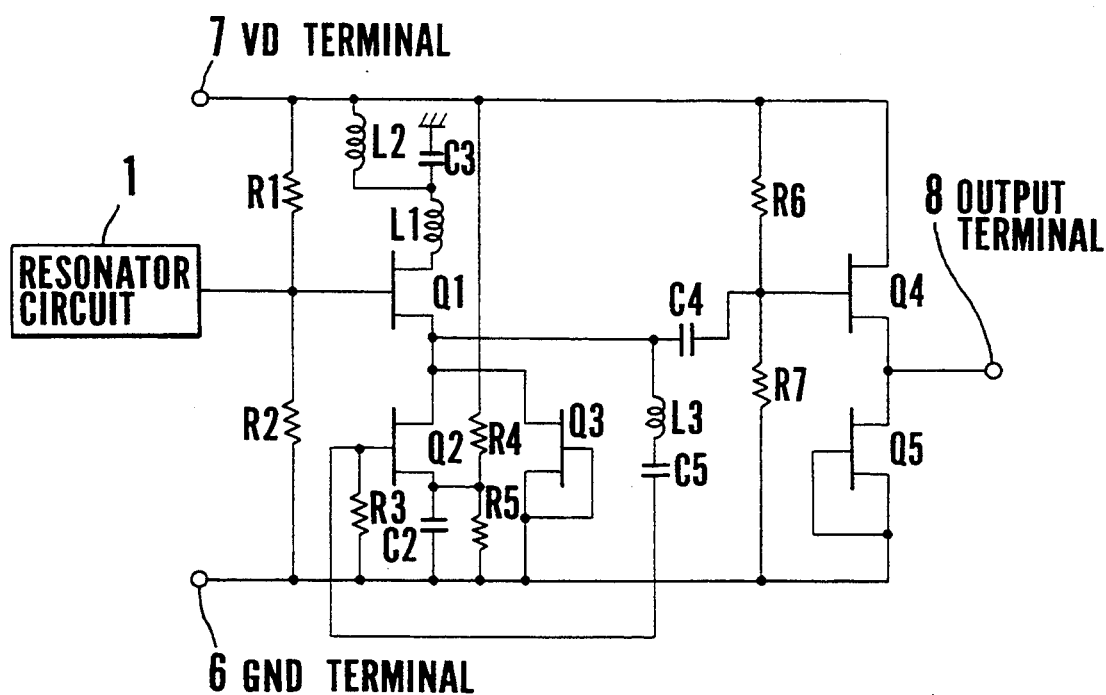
FIG. 10 is a like circuit diagram as in FIG. 2 but illustrating a ninth embodiment of the present invention.

Referring to FIG. 10, there is illustrated a circuit diagram of a ninth embodiment of the present invention.

In the present embodiment which constructs a dual gate FET together with FETQ2 serves as an FET for oscillation with oscillation conditions defined by L1, C3, and the equivalent capacitance of FETQ2 connected to the source of FETQ1. For example, employed 0.3∼0.7 nH L1, 2 pF C3 and 200 μm gate width FETQ2, FETQ1 can be oscillated in the vicinity of a frequency range 9∼12 GHz. By connecting in this state the resonator circuit 1 with the gate of FETQ1, FETQ1 can be oscillated at the resonance frequency of the resonator circuit 1 located in an oscillatable frequency region. An oscillation output is available everywhere at that time, but it is likely to be obtained from the gate and source of FETQ1 which are relatively high impedance. Contrarily, the second FETQ2 is operable as an FET mixer, and constructs a drain injection type FET mixer which serves to output from the drain of FETQ2 a signal having sum and difference frequency components of signals inputted to the drain and gate of FETQ2.

Accordingly, as illustrated in FIG. 10, provided part of the oscillation signal yielded from the source of FETQ1 is inputted to the gate of FETQ2 through inductance L3 and capacitance C5, signals of the same frequency are inputted to the gate and drain of FETQ2, and hence a sum signal of a frequency twice the oscillation frequency of FETQ1 is derivable from the drain of FETQ1.

The present embodiment is adapted such that the second harmonic is inputted to FETQ3 through C4, L3, and C5, and the oscillation frequency signal is inputted to the gate of FETQ2. Herein, L3 and C5 are not necessarily be required to be series-connected. On the other hand, conversion efficiency of FETQ3 depends upon the operating point of FETQ3. In the present embodiment, the third FETQ3 is connected in parallel with FETQ2, and a current flowing through FETQ1 flows to FETQ3. For example, FETQ3 serves as a current source by setting the gate width of FETQ3 to $\frac{1}{2}$ of the gate width of FETQ1 and short-circuiting the gate and the source to each other, and FETQ1 can be operated at $\frac{1}{2}$ $I_{Dss}$ and FETQ2 operated at a point where it pinched off, by selecting the resistance of R5. In this case, about −2 dB conversion gain is available as the conversion efficiency of FETQ2, which exceeds the performance of the prior art frequency doubler composed of two filters and a diode. FETQ4 serves as a source follower and constructs a buffer amplifier together with FETQ5. The second harmonic signal from the drain of FETQ2 is inputted to the gate of FETQ4 through the DC cut capacitor C4 and impedance-converted through the buffer amplifier, and thereafter outputted from the output terminal 8. Herein, the provision of the buffer amplifier enables the present oscillator circuit to be operated without alteration of the oscillation conditions of FETQ1 due to load impedance connected to the output terminal.

Figure 11:
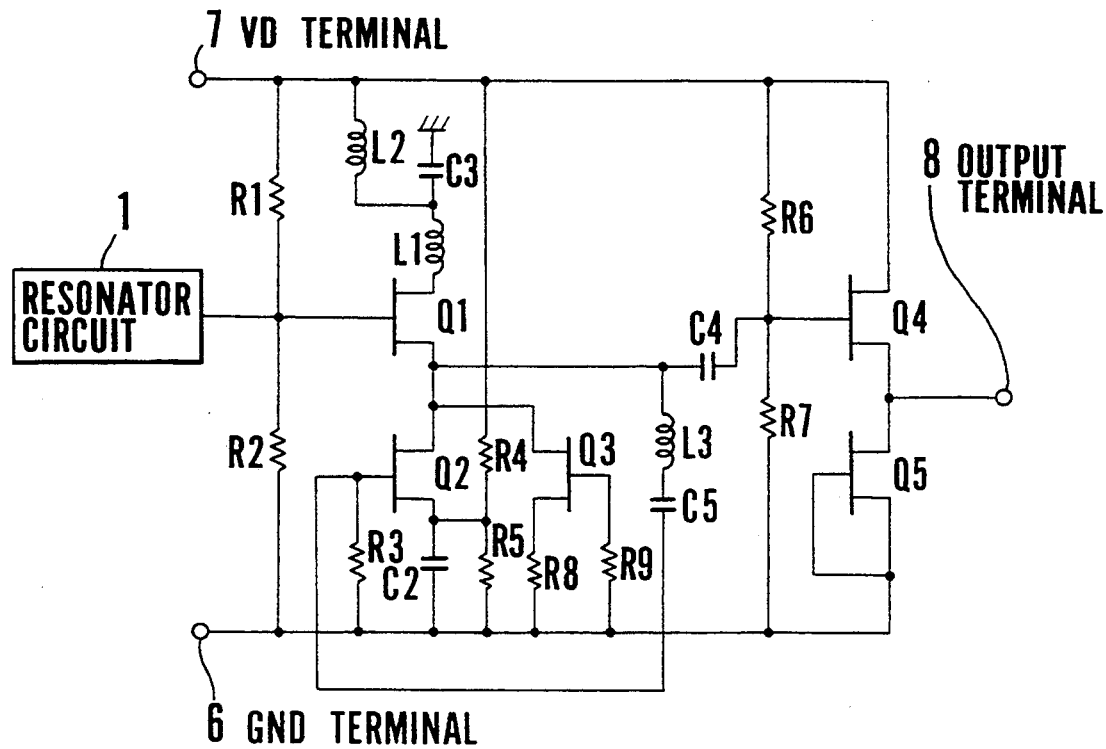
FIG. 11 is a like circuit diagram as in FIG. 2 but illustrating a tenth embodiment of the present invention.

Referring further to FIG. 11, there is illustrated a tenth embodiment of the present invention, in which FETQ3 of FIG. 10 is not operated at $I_{Dss}$ but can be set to an arbitrary operating point by a self-bias circuit composed of R8 and R9. More specifically, the operating point of FETQ1 can be altered by R8 and simultaneously the gate width of FETQ3 can also be arbitrarily set.

Figure 12:
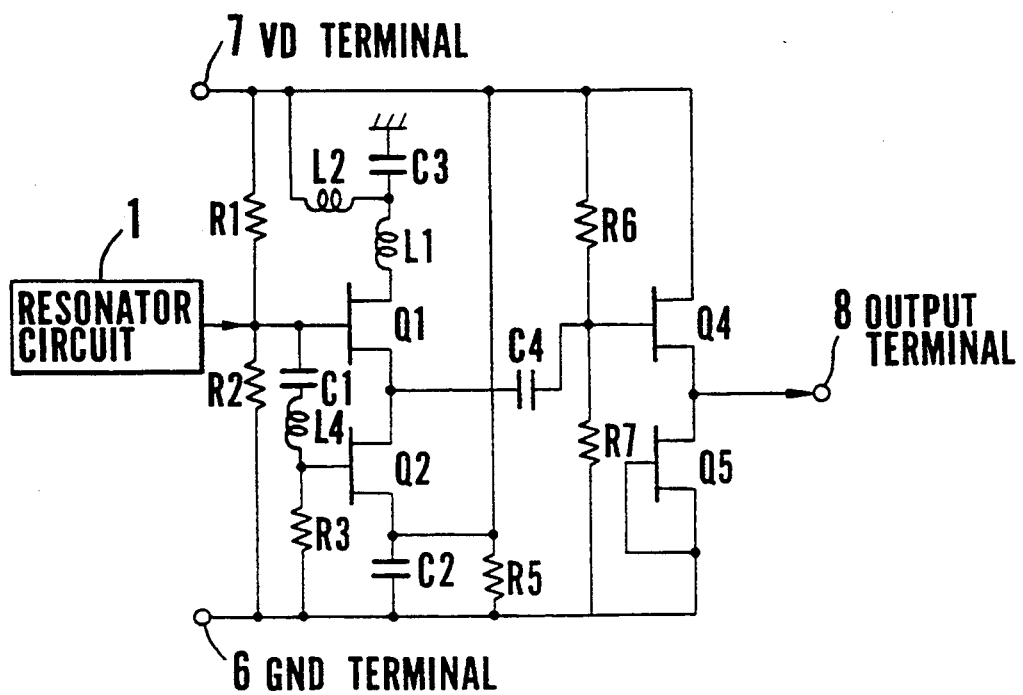
FIG. 12 is a like circuit diagram as in FIG. 2 but illustrating an eleventh embodiment of the present invention.
Figure 13:
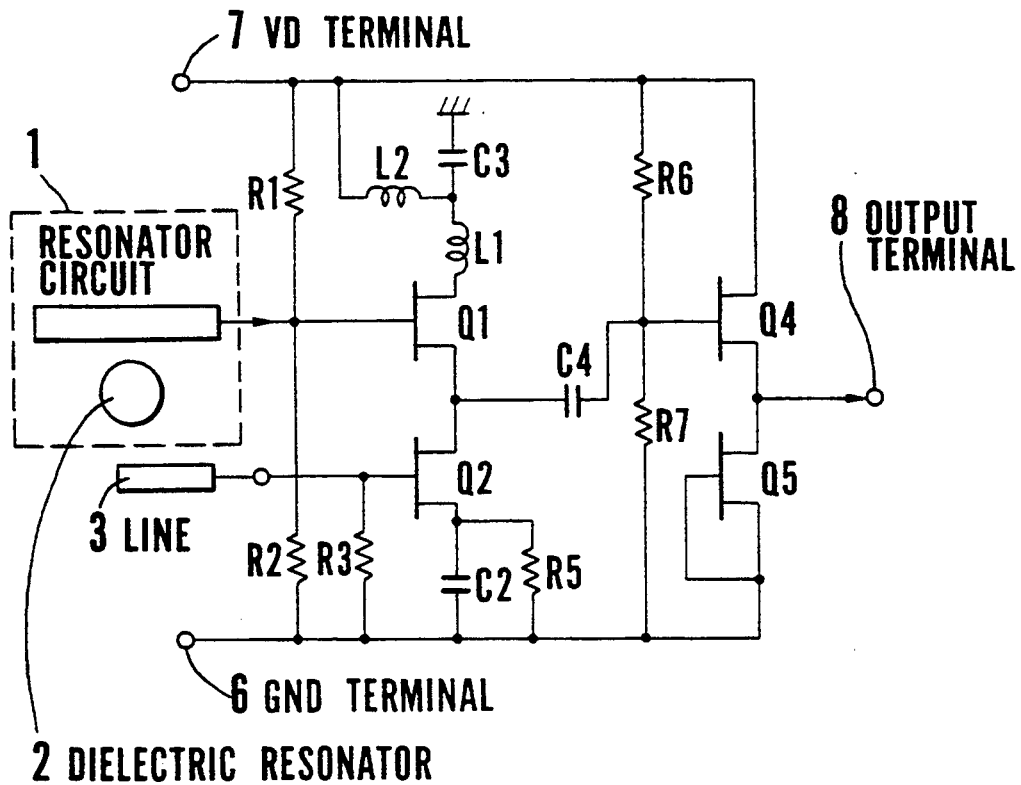
FIG. 13 is a like circuit diagram as in FIG. 2 but illustrating a twelfth embodiment of the present invention.

Referring to FIGS. 12 and 13, there are illustrated eleventh and twelfth embodiments of the present invention, in which for injecting the oscillation output of FETQ1 to the gate of FETQ2 the gates of FETQ1 and FETQ2 are coupled. Although in FIG. 12, capacitance C1 and inductance L4 are series-connected as a coupling element, use may be made of parallel and series combinations of capacitances and inductances. This may otherwise be constructed only with capacitance.

FIG. 13 illustrates exemplarily the use of the dielectric resonator 2 as the coupling element. The gates of FETQ1 and FETQ2 may be coupled through a transformer in such a manner. It should be noted herein that although in the examples of FIGS. 12 and 13 there is not shown the third FETQ3 illustrated in FIGS. 10 and 11, the operation principle is the same, and the third FETQ3 may be existent as a matter of course. Reversely, the third FETQ3 in FIGS. 10 and 11 may not be provided. In the case without the third FETQ3, the same effect is ensured as in the case with the third FETQ3 by setting the gate width of the second FETQ2 to that twice the gate width of the first FETQ1. For example, assume the ratio of the gate widths of FETQ2 and FETQ1 to be 5 : 1, FETQ2 is operable at the operating point of $1/10\ I_{DSS}$ when FETQ1 is operated at $\frac{1}{2}\ I_{DSS}$. In this case, about $-4$ dB conversion gain available as the conversion efficiency of FETQ2.

Figure 14:
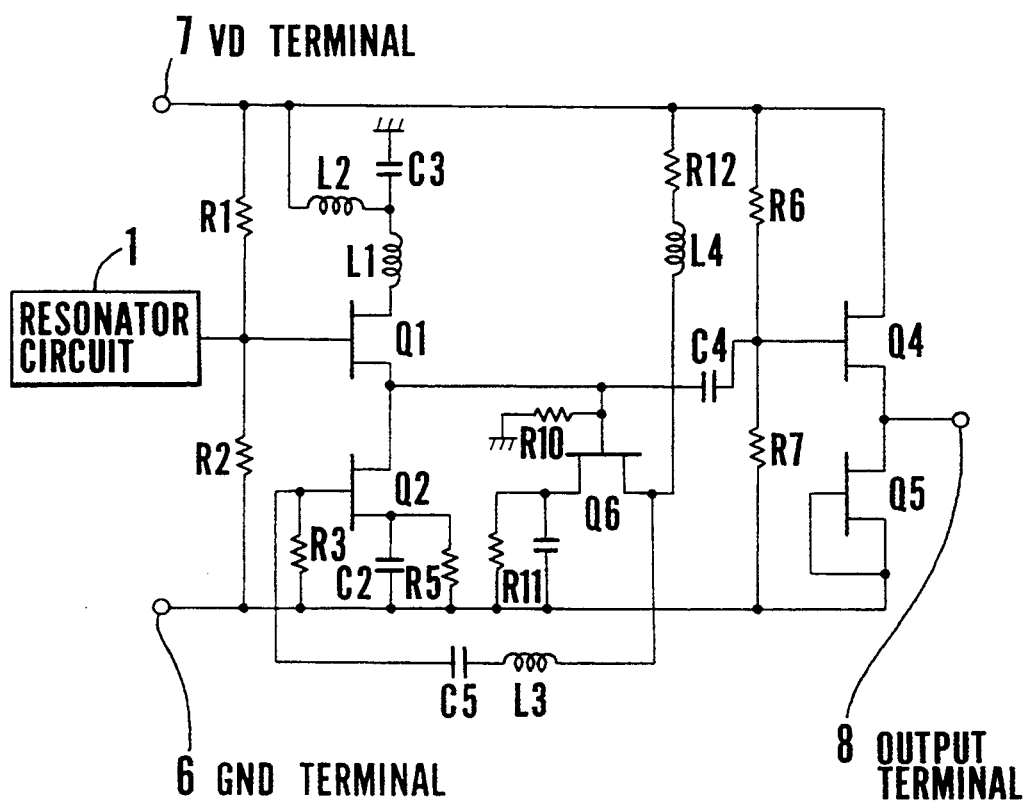
FIG. 14 is a like circuit diagram as in FIG. 2 but illustrating a thirteenth embodiment of the present invention.

Referring to FIG. 14, there is illustrated a thirteenth embodiment of the present invention, in which for inputting the oscillation output from FETQ1 to the gate of FETQ2 the oscillation output of FETQ1 is not inputted to the gate of FETQ2 through L3 but is inputted to the gate of FETQ2 after amplified by FETQ6. With this construction, the input level to FETQ2 is raised together with the rise of the conversion level of the second harmonic, and the oscillation frequency signal can be amplified and the second harmonic signal can be reflected by selecting the matching conditions of an amplifier constructed with FETQ6. Thus, the more effective second harmonic is available from the output terminal 8. In FIG. 14 a circuit is ensured which selectively amplifies only the oscillation signal utilizing parallel resonance formed with L4, R12, and equivalent input capacitance of FETQ2.

It will be noted that the embodiment shown in FIG. 13 has no resistance R4 in comparison with the embodiment shown in FIG. 3. In the same manner, it is to be noted that the present invention is enable with the embodiments shown in FIGS. 2, 4, 5, 6, 7, 8, 9, 10, 11 and 12 without resistance R4.

According to the present invention, as described above, the microwave oscillator circuit is constructed as the dual gate one and the gate width of the second FET is set to be twice that of the first FET, and further the gates of the first and second FETs are rendered to the high frequency coupling. Hereby, the microwave oscillator and the frequency doubles can simultaneously be constructed without the need of such a DC return circuit as in the prior art, and MMIC can be achieved with its area reduced about the half of the prior art circuit constructed likewise as MMIC.

What is claimed is:

1. A microwave oscillator circuit, connected to a resonator circuit generating a signal at a frequency f, for producing at its output a signal at frequency nf comprising:
   a first field effect transistor having a gate connected to said resonator circuit;
   a second field effect transistor whose source/drain path is connected in series with the source/drain path of said first field effect transistor; and
   a connecting circuit for one of coupling the gate and coupling the source, source of said first field effect transistor to a gate of said second field effect transistor such that a signal at frequency nf is output at a node corresponding to a connection point between the source of the first field effect transistor and the drain of the second field effect transistor.

2. A microwave oscillator circuit according to claim 1 wherein said connecting circuit is a high frequency coupling circuit connected between a gate of said first FET and a gate of said second FET.

3. A microwave oscillator circuit according to claim 2 wherein the gate width of said second FET has a gate width two or more times the gate width of said first FET.

4. A microwve oscillator circuit according to claim 2 further comprising a third FET connected in parallel with said second FET.

5. A microwave oscillator circuit according to claim 1, wherein said connecting circuit includes means coupled between the source of said first field effect transistor and the gate of said second field effect transistor to supply said second field effect transistor with a signal relative to said signal derived from said node.

6. A microwave oscillator circuit according to claim 2 wherein sad high frequency coupling circuit comprises a coupling capacitor.

7. A microwave oscillator circuit according to claim 2 wherein said high frequency coupling circuit is constructed through interline coupling with a dielectric resonator.

8. A microwave oscillator circuit according to claim 1 wherein a circuit is connected with the source of said second FET to control an operation current of said second FET.

9. A microwave oscillator circuit according to claim 1 wherein said connecting circuit is located between the source of the first FET and the gate of the second FET.

10. A microwave oscillator circuit according to claim 9 wherein said connecting circuit comprises a coupling circuit that includes an inductance.

11. A microwave oscillator circuit according to claim 9 further comprising a third FET connected in parallel with said second FET.

* * * * *

UNITED STATES PATENT AND TRADEMARK OFFICE
CERTIFICATE OF CORRECTION

PATENT NO. : 5,341,111
DATED : August 23, 1994
INVENTOR(S) : Tatsuya Miya

It is certified that error appears in the above-identified patent and that said Letters Patent is hereby corrected as shown below:

Column 8, line 28, delete "microwve", and insert --microwave--;

Column 8, line 38, delete "sad", and insert --said--.

Signed and Sealed this

Eighth Day of November, 1994

Attest:

BRUCE LEHMAN

Attesting Officer    Commissioner of Patents and Trademarks